United States Patent
Vasanth et al.

(10) Patent No.: US 6,530,064 B1
(45) Date of Patent: Mar. 4, 2003

(54) METHOD AND APPARATUS FOR PREDICTING AN OPERATIONAL LIFETIME OF A TRANSISTOR

(75) Inventors: Karthik Vasanth, Richardson, TX (US); Shian-Wei Aur, Plano, TX (US); E. Ajith Amerasekera, Plano, TX (US); Sharad Saxena, Richardson, TX (US); Joseph C. Davis, Allen, TX (US); Richard G. Burch, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 229 days.

(21) Appl. No.: 09/692,692

(22) Filed: Oct. 19, 2000

Related U.S. Application Data

(60) Provisional application No. 60/171,771, filed on Dec. 29, 1999.

(51) Int. Cl.[7] ............................ G06F 17/50; G06F 17/10
(52) U.S. Cl. ............................... 716/4; 703/2; 703/14
(58) Field of Search ................ 716/1–21; 438/305, 438/14; 703/22, 13, 15, 2, 14; 364/578, 488

(56) References Cited

U.S. PATENT DOCUMENTS

| | | | | |
|---|---|---|---|---|
| 5,508,632 A | * | 4/1996 | Shimizu et al. | 324/765 |
| 5,600,578 A | * | 2/1997 | Fang et al. | 324/765 |
| 5,615,377 A | * | 3/1997 | Shimizu et al. | 324/765 |
| 5,999,011 A | * | 12/1999 | Chu et al. | 324/769 |
| 6,216,099 B1 | * | 4/2001 | Fang et al. | 257/344 |
| 6,274,449 B1 | * | 8/2001 | Vasanth et al. | 438/14 |
| 6,381,564 B1 | * | 4/2002 | Davis et al. | 700/30 |

OTHER PUBLICATIONS

D.Rowlands, S.Dimitrijev and H.B.Harrison "Effect of gate to source / drain junction separation on the device lifetime", 13th Australian Microelectronic Conference. Technology Today for the Future. Proceedings. MICRO'95 pp. 136–140.*

N. Kasai, I. Yamamato, and K. Koyama "Electrical Gate Length Measurement Test Structure for Short Channel MOSFET Characteristics Evaluation", Proc. IEEE 1995 Int. Conference on Microelectronics Test Structures, vol. 8 Mar. 1995 pp. 39–44.*

* cited by examiner

*Primary Examiner*—Vuthe Siek
*Assistant Examiner*—Magid Y Dimyan
(74) *Attorney, Agent, or Firm*—Peter K. McLarty; W. James Brady, III; Frederick J. Telecky, Jr.

(57) ABSTRACT

An operational lifetime, and also performance characteristics, can be accurately predicted for an experimental transistor design (10) and a specified set of fabrication process conditions (117), without actually fabricating and testing a physical transistor made according to the particular design data and process conditions. With respect to the prediction of an operational lifetime, the operational lifetime can be expressed as a function of the size of a gate overlap (12) of the transistor, and this relationship is valid throughout a selected semiconductor technology for which the transistor is designed. The size of the gate overlap is determined by selecting a combinations of values for two process conditions.

8 Claims, 2 Drawing Sheets

ମETHOD AND APPARATUS FOR PREDICTING AN OPERATIONAL LIFETIME OF A TRANSISTOR

This application claims priority under 35 USC § 119(e)(1) of provisional application No. 60/171,771 filed Dec. 22, 1999.

TECHNICAL FIELD OF THE INVENTION

This invention relates in general to techniques for transistor design and, more specifically, to the determination of a transistor operational lifetime during transistor design.

BACKGROUND OF THE INVENTION

As an integrated circuit is used, the transistors in the integrated circuit may degrade over time and decrease in performance. The length of time before a transistor in an integrated circuit degrades beyond a certain point is referred to as the operational lifetime of the transistor.

As integrated circuits have become increasingly more important in today's society, the complexity of integrated circuits has also increased. The increasing complexity of integrated circuits has led to a need for more efficient analysis of integrated circuits during the design phase. For example, traditional methods of determining the expected operational lifetime of a transistor require fabrication of the transistor and then empirical testing of the transistor. Specifically, traditional methods involve designing a transistor with a view to a desired level of performance, selecting process conditions for fabricating the transistor, fabricating the transistor, and then empirically testing the fabricated transistor to determine its actual performance and operational lifetime. The empirical testing typically takes several days, and the entire procedure, including design, fabrication, and empirical testing of the transistor typically takes several months to complete.

If the actual performance and operational lifetime are not satisfactory, adjustments are made to the fabrication process conditions, or possibly the design itself, and then the entire procedure is repeated. More specifically, the entire process is typically repeated a number of times, until the device design converges to a configuration with satisfactory performance and operational lifetime values. This interative procedure typically requires a large time investment before a design with satisfactory performance and lifetime characteristics is found. It is not unusual for the entire iterative procedure to take a year and a half.

One traditional method of operational lifetime determination includes testing the transistor at operational voltages which are in excess of the normal operational voltage of the transistor, in order to decrease the amount of time required for the transistor to degrade in performance. The change in some characteristic of the transistor is measured at each such operational voltage, and then the normal operational lifetime of the transistor is extrapolated from this data. One such characteristic which is commonly used is the threshold voltage required to turn the transistor on. By plotting the measured operational lifetime for each excessive operational voltage, an operational lifetime for the transistor at a normal operational voltage can be determined by extrapolating it from the curve.

Hypothetically, for example, a transistor with a normal operational voltage of 5 volts may be separately tested at 8 volts and at 7 volts, and the change in threshold voltage over time can be measured for each such voltage. Assume hypothetically that the rate of change in the threshold voltage for an operational voltage of 8 volts is a value which corresponds to a lifetime of 1 hour, and that the rate of change in the threshold voltage for an operational voltage of 7 volts is a value which corresponds to a lifetime of 10 hours. These values and other similar values can then be plotted on a graph, a curve through the plotted points can be determined, and then an operational lifetime for the transistor at an operational voltage of 5 volts can be determined by extrapolating it from the curve connecting the experimental points. A variation of this technique involves plotting lifetime versus the inverse of voltage, because the resulting curve tends to be closer to a straight line, making it easier to use extrapolation to determine a lifetime for a normal operational voltage.

Another traditional technique for determining the operational lifetime of a transistor involves stressing the transistor by applying various gate voltages and measuring the substrate current. There is a gate voltage which induces a maximum or peak substrate current for the transistor, which in turn applies the greatest stress to the transistor under this approach. Measurements made at different gate voltages can be used to plot a curve of lifetime versus gate voltage, which in turn can be used to extrapolate the lifetime that the transistor should have under normal operational conditions.

As evident from the foregoing discussion, it is possible to plot a curve representing the operational lifetime of a transistor versus substrate current. It is known that such a curve can be expressed mathematically by the following equation, where $\tau$ is operational lifetime, $I_{sub}$ is the substrate current, and $A_0$ and n are constants.

$$\tau = A_0(I_{sub})^{-n}$$

In some cases, the constant n in the foregoing equation may be determined without empirical testing. However, there has been no known technique by which the value of the constant $A_0$ can be determined, except through empirical testing of an actual transistor having the particular design as to which an operational lifetime is of interest.

From the foregoing discussion, it will be recognized that one of the drawbacks to all traditional methods of determining operational lifetime is that, for any given set of fabrication process conditions for a given transistor design, a transistor must be actually fabricated and then empirically tested in order to determine an operational lifetime for that particular transistor. As discussed above, determining an operational lifetime through empirical testing may take several days. Consequently, since the design of a new transistor and the selection of fabrication process conditions is an iterative procedure that includes a number of cycles, where each cycle involves adjustment, fabrication.and testing/evaluation, and since each evaluation of lifetime requires several days of testing, the overall design procedure from start to finish through several such cycles can be relatively long.

SUMMARY OF THE INVENTION

From the foregoing, it may be appreciated that a need has arisen for a method and apparatus for accurately predicting an operational lifetime for a new transistor design, without fabricating the new transistor in order to empirically measure the lifetime. According to the present invention, a method and apparatus are provided to address this need, and involve predicting an operational lifetime of a transistor based on design data for the transistor.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
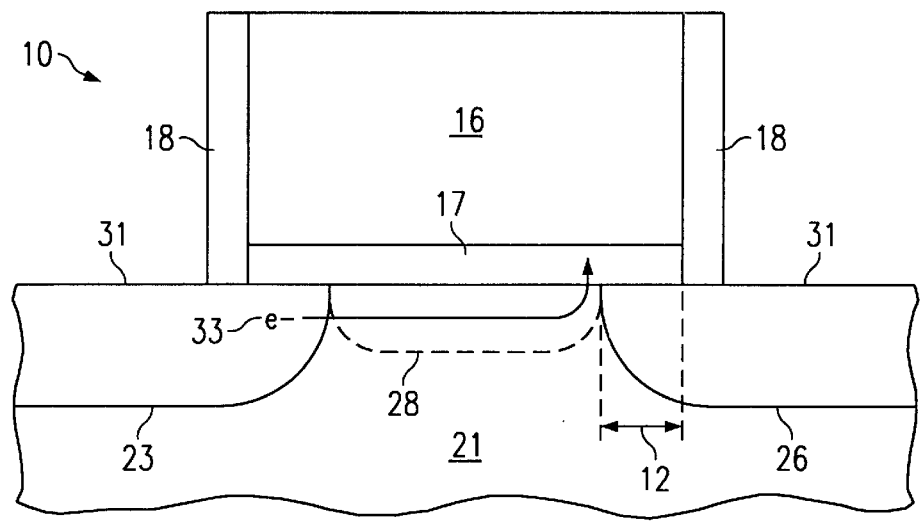
FIG. 1 is a cross-sectional side view of an integrated circuit that includes a transistor, the design of which can be optimized using techniques according to the present invention.

FIG. 1 is a cross-sectional side view of part of a semiconductor device which includes a transistor 10, and shows a gate overlap 12 of the transistor. The method and apparatus of the present invention can be used to facilitate the design of the transistor 10. In the disclosed embodiment, transistor 10 is a field-effect transistor (FET).

In more detail, transistor 10 includes a portion of a substrate 21 which is disposed beneath a gate electrode 16, an oxide layer 17 between substrate 21 and the gate electrode 16, and a pair of sidewalls 18. Substrate 21 is a silicon semiconductor material. Substrate 21 includes a doped source region 23, a doped drain region 26, and a channel region 28. An interface 31 is defined by the boundary between substrate 21 and oxide layer 17. Gate electrode 16 and oxide layer 17 are bounded by the sidewalls 18. Gate electrode 16 is formed from a polysilicon material, and sidewalls 18 from a nitride material. Gate electrode 16 is disposed on gate oxide layer 17. Gate oxide 17 is formed from silicon dioxide.

Gate overlap 12 is the overlap between drain 26 and the gate structure which includes oxide layer 17 and gate electrode 16. Gate overlap 12 has an associated overlap capacitance value, the magnitude of the overlap capacitance varying directly in relationship to the size of gate overlap 12. The size of gate overlap 12 may be controlled during fabrication of transistor 10, for example by appropriate selection of values for two process conditions associated with fabrication of transistor 10.

More specifically, the respective values of a pocket doping level and a drain extender doping level each affect the size of gate overlap 12. Pocket doping and drain extender doping are techniques which are known in the art, and are therefore described only briefly here, to facilitate an understanding of the present invention. These two doping techniques are typically performed at about the same time during the fabrication of an integrated circuit. Usually, both pocket doping and drain extender doping are done after the gate structure has been formed. Pocket doping is carried out at a respective angle on each side of the gate structure. Drain extender doping is carried out approximately vertically on each side of the gate structure, but tends to diffuse to some extent under the gate structure. An increase in the level of drain extender doping will increase the size of gate overlap 12. An increase in the level of pocket doping will decrease the size of gate overlap 12.

Although the disclosed embodiment uses the two process conditions of drain extender doping and pocket doping to control the size of the gate overlap 12, it will be recognized that there are other process conditions which also affect the size of the gate overlap, and which could alternatively be used in association with the present invention. For example, heating the integrated circuit at an appropriate point during fabrication can affect the size of the gate overlap.

When the transistor 10 is in use, and as an electron 33 travels from source 23 to drain 26 through channel 28, electric fields can cause electron 33 to become over-energized and to break through interface 31 into gate oxide 17, usually in the vicinity of drain 26. An electron 33 which has become over-energized is known as a channel hot carrier (CHC). When such an electron breaks through the interface 31, it may break molecular bonds at the atomic level in the region of interface 31, usually near drain 26. Electron 33 may also become trapped in the gate oxide 17. As the number of trapped electrons progressively increases, there can be a progressive increase in the threshold voltage required to turn the transistor on, which in turn can cause a progressive decrease in the effective drive current for a given input voltage.

A further consideration is that an electron traveling through the channel 28 and having sufficient energy may collide with a silicon atom in substrate 21, and knock an electron out of the silicon atom. The absence of the electron in the atom creates a hole, which tends to flow into the substrate 21, or in other words downwardly in FIG. 1. The cumulative flow of many such holes is known as the substrate current ($I_{sub}$), and its magnitude is representative of the number of collisions that have occurred.

As mentioned above, electrons breaking into the gate oxide layer 17 can increase the threshold voltage needed to turn on the transistor 10. For a given operational context of the transistor 10, the time interval needed for the threshold voltage to increase by 10% is arbitrarily defined to be the operational lifetime of the transistor. As discussed above, existing techniques for determining the operational lifetime of a particular transistor design require that the transistor be fabricated and tested so that the operational lifetime can be determined by measurement. There has been no known technique for accurately predicting the operational lifetime of a particular transistor design without actually building and testing it. A feature of the present invention is that it provides the capability, for a specified semiconductor technology, to predict the operational lifetime for a particular transistor design, without actually building and testing that particular transistor. For purposes of explaining the present invention, the transistor 10 of FIG. 1 is treated as a new transistor design, to which the method according to the present invention will be applied.

In this regard, a feature of the present invention is the discovery that there is a correlation between the gate overlap 12 of a transistor and the operational lifetime of that transistor. In view of this correlation, the invention further includes the provision of the following equation, which expresses this relationship between gate overlap 12 and the operational lifetime of a transistor:

$$\tau = C e^{(mXov)} (I_{sub})^{-n} \tag{1}$$

In equation (1), $\tau$ is the predicted operational lifetime, C is a first constant, m is a second constant, $I_{sub}$ is the substrate current, n is a third constant, and $X_{ov}$ is the gate overlap 12. The first, second and third constants represent characteristic information associated with a given semiconductor technology, and are the same for any transistor designed within that semiconductor technology. Once the first, second and third constants are determined for a given semiconductor technology, the operational lifetimes for new transistors based on that semiconductor technology are predictable as a function of design data and fabrication process conditions, without testing an actual transistor fabricated according to the design data and process conditions.

Figure 2:
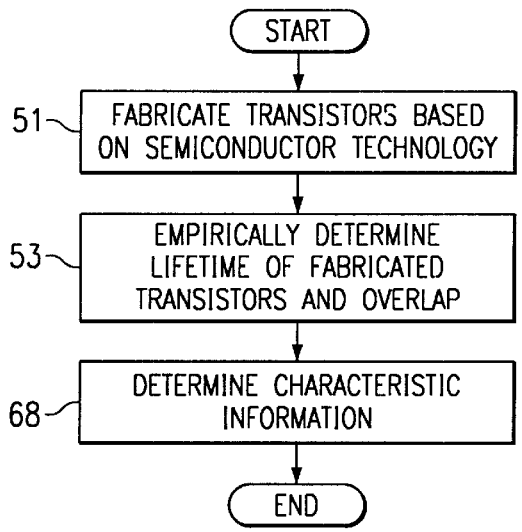
FIG. 2 is a flowchart illustrating a method according to the invention for determining characteristic information for a semiconductor technology in which a transistor such as that shown in FIG. 1 may be implemented.

FIG. 2 is a flowchart illustrating a method for determining characteristic information for a given semiconductor technology, which includes the constants C, m and n discussed above in association with equation (1). The method of FIG. 2 is a one-time initial analysis for any given semiconductor technology and, once it has been completed, new transistor designs can be developed in that technology, and their lifetimes predicted, without any subsequent empirical testing.

For purposes of the present invention, a semiconductor technology is a definition of factors such as the particular type of semiconductor, for example NMOS, and a particular structural geometry for a transistor. A given semiconductor technology may include sub-technologies that represent the minimum size permitted for certain structural features, such as the width of conductive interconnects in a metalization layer. For example, in one sub-technology the minimum permitted size is 0.15 microns, whereas another sub-technology may specify a larger minimum size such as 0.25 microns or 0.50 microns.

The method begins at block 51 in FIG. 2, where a plurality of transistors which use the selected semiconductor technology are fabricated. In theory, only one fabricated transistor is needed, but typically several are used in order to ensure accuracy. Ideally, these transistors are fabricated so as to have different sizes of gate overlap 12. Next, at block 53, operational lifetime information and the gate overlap 12 for each of the fabricated transistors is empirically determined. The empirically determined overlap and lifetime information are then used to determine the three constants C, m and n which are part of the characteristic information associated with the selected semiconductor technology, as explained later.

To empirically determine the gate overlap of each fabricated transistor, the overlap capacitance is empirically measured, which is the capacitance between the gate and drain. Then, the size of the gate overlap is determined from the overlap capacitance. As mentioned above, the overlap capacitance varies in direct relation to the size of the overlap.

To empirically determine the operational lifetime, each fabricated transistor is first operated under normal conditions, and its associated drive current is measured. Next, the fabricated transistor is stressed for a predetermined time period by biasing it at voltages substantially in excess of the rated or normal operational values, and the substrate current ($I_{sub}$) is then measured using a known technique. The process of alternating the fabricated transistor between normal operating conditions and stressed operating conditions is iteratively repeated, for example until the measured drive current under normal operating conditions has degraded by a cumulative amount of 10% from its original value.

Figure 3:
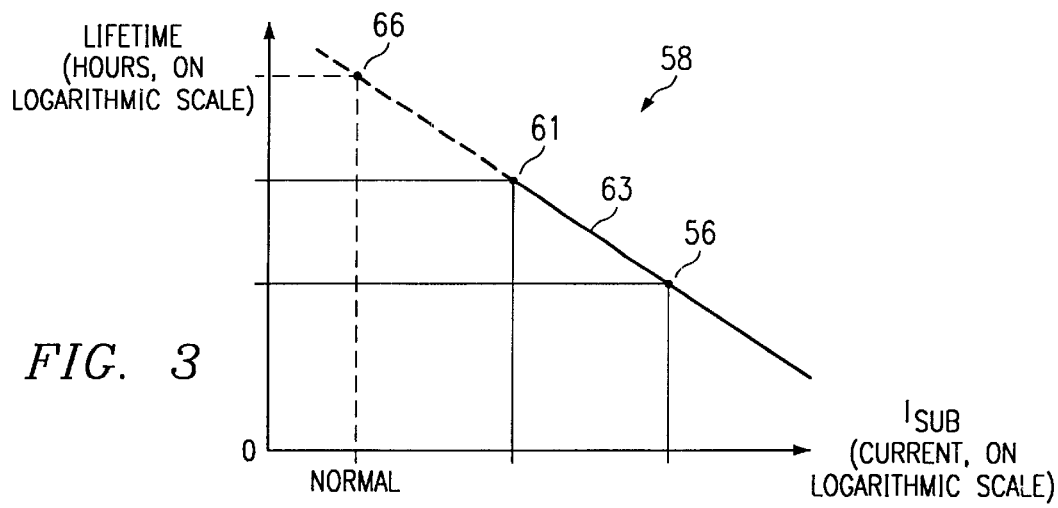
FIG. 3 is a graph illustrating an exemplary curve representing lifetime versus substrate current for a transistor such as that shown in FIG. 1.

Using the information gained in respective iterations of this testing process, lifetime can be plotted relative to substrate current, for example, as shown in FIG. 3. Values for C, m, and n can be determined from this information. This testing process may involve several days of testing in a lab, but is far faster than attempting to determine the lifetime by operating a transistor under normal conditions until the drive current has decreased by 10%.

Turning in more detail to FIG. 3, an exemplary graph 58 is shown for one such transistor, and illustrates lifetime versus substrate current ($I_{sub}$), with each axis being a logarithmic scale. An exemplary fabricated transistor is empirically tested using the above-described process, and the results are plotted on the graph 58. Graph 58 includes points 56 and 61 corresponding to different iterations of the testing process, and a line 63 extends through these points. Point 56 identifies a first lifetime at a measured substrate current based on data from one test iteration, and point 61 identifies a second lifetime at a different measured substrate current based on data from another test iteration. The measured substrate currents are measured while the fabricated transistor is being stressed as described above. Traditionally, the expected operational lifetime would then be determined by extrapolating line 63 through points 56 and 61 and determining where the line would intersect with a normal operational value of the substrate current. In FIG. 3, point 66 represents the expected lifetime at the normal operational value for the substrate current.

Then, referring again to FIG. 2, characteristic information such as C, m and n is determined at block 68. The constant n represents the slope of the line 63 in FIG. 3. The values for C and m are determined by parametrically solving equation (1) using the measured values for the substrate current and the measured values for the operational lifetime, while replacing n with a value representing the slope of line 63. More specifically, two equations are created which each correspond to equation (1). The two measured lifetimes are each substituted for $\tau$ in a respective equation, the two measured substrate currents are each substituted for $I_{sub}$ in a respective equation, the measured slope is substituted for n in both equations, and the measured gate overlap for the particular transistor is substituted for $X_{ov}$ in both equations. These two equations are then solved parametrically to determine the first constant C and second constant m. As mentioned above, the determination of C, m and n is done only once for a given semiconductor technology. After that, the operational lifetimes of new transistors in that semiconductor technology can be predicted, without any need to build and test an actual transistor.

Figure 4:
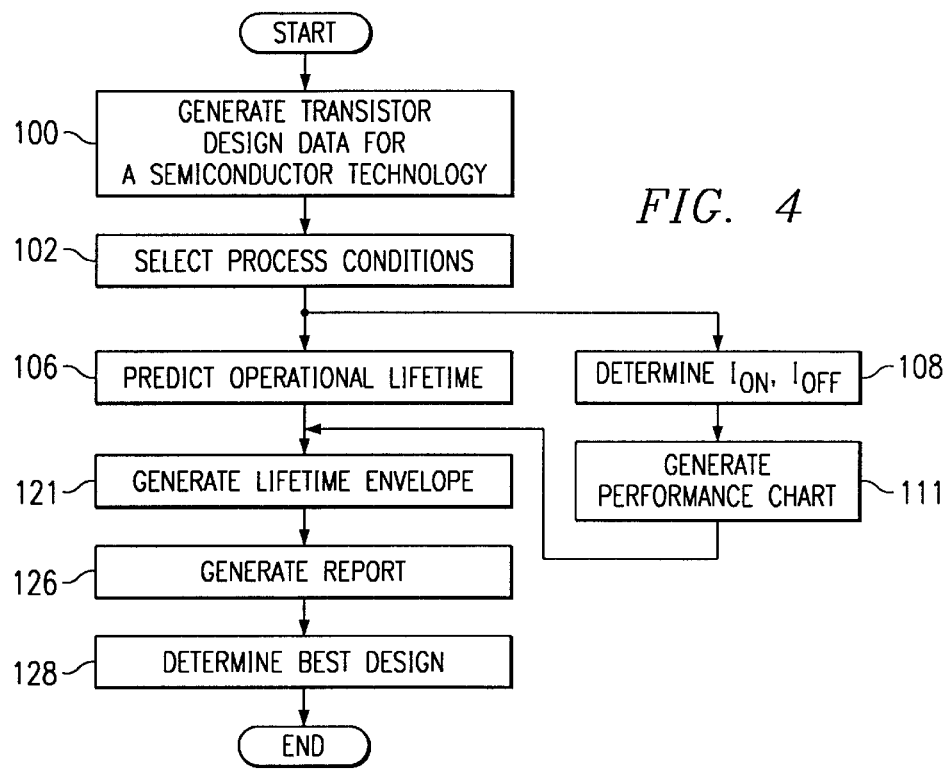
FIG. 4 is a flowchart illustrating a method according to the invention for predicting the operational lifetime and the performance characteristics of a new transistor, such as the transistor of FIG. 1, based on design data for the new transistor.

More specifically, FIG. 4 is a flowchart illustrating a method for predicting the operational lifetime and the performance characteristics of a new transistor design, based on design data and selected fabrication process conditions for the new transistor, without any need to build and test an actual transistor. The transistor is designed for a specific semiconductor technology, for which C, m and n are known because they have previously been determined.

The method begins at block 100, where design data for the new transistor is generated in a known manner. Next, at block 102, a plurality of values for two process conditions are selected for evaluation. Specifically, various respective values for the drain extender doping level and the pocket doping level are selected. As discussed above, these two process conditions affect the size of the gate overlap, which in turn affects the lifetime of the transistor. Consequently, a number of different combinations of values for these two process conditions are selected for evaluation with respect to factors such as the lifetime and the performance of the transistor, so that one of these combinations which has suitable performance and lifetime characteristics can ultimately be selected for subsequent use in actually building the transistor. The various different combinations of process conditions are sometimes referred to herein as respective versions of the new transistor design.

Next, at block 106, a respective operational lifetime is predicted for each combination of process conditions for the new transistor, based on the design data. Each operational lifetime is predicted by using a process simulator computer program to determine the overlap which would result from the particular combination of process conditions, by using the results of the process simulator program in a device simulator computer program to determine the substrate current $I_{sub}$ for the new transistor design, and by using these values for overlap and substrate current to solve equation (1) for $\tau$, which is the predicted lifetime. As mentioned above, C, m and n are already known for the selected semiconductor technology.

The device simulator computer program used in the disclosed embodiment is an existing program which is commercially available under the tradename MEDICI from Technology Modeling Associates, Inc. (TMA) of Sunnyvale, Calif. The process simulator computer program used in the disclosed embodiment is an existing program which is also available commercially from TMA, under the tradename SUPREM. However, other equivalent programs could alternatively be used.

In block 108, which can be performed in parallel with block 106, a drive or on current ($I_{on}$) and a leakage or off current ($I_{off}$) are determined for each version of the new transistor, using the process and device simulator programs discussed above. The drive current and off current are determined for each version of the new transistor, or in other words each of the selected combinations of process conditions, and are representative of the performance of each of the versions of the new transistor. In the disclosed embodiment, acceptable performance is evaluated by comparing the drive current and off current to predetermined criteria. In particular, the drive current is deemed to represent acceptable performance if it has a value between 450 and 550 microamperes per micrometer ($\mu A/\mu m$). The off current is deemed to represent acceptable performance if it has a value less than 1 nanoampere (nA).

Figure 5:
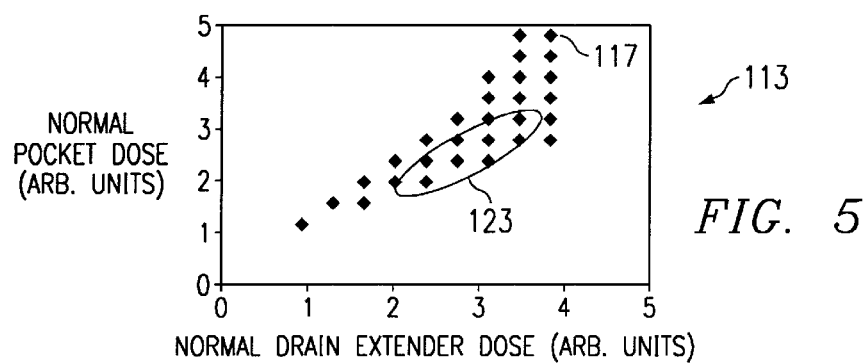
FIG. 5 is an exemplary performance chart according to the present invention, which presents performance information for a transistor such as that shown in FIG. 1.

Next, at block 111, which can also be performed in parallel with block 106, a performance chart is generated. FIG. 5 depicts an exemplary performance chart 113 according to the present invention. Performance chart 113 includes a plurality of points 117, and represents pocket doping level versus drain extender doping level, with each axis having a normalized scale. Each point 117 plotted on chart 113 identifies a transistor version, or in other words a respective combination of process conditions, which has acceptable performance as to both the drive current and off current. As to combinations of the process conditions for which one or both of the drive current and off current fail to meet the specified performance criteria, corresponding points are not plotted on chart 113.

Then, at block 121, a lifetime envelope 123 (FIG. 5) is generated. In the disclosed embodiment, envelope 123 is superimposed on chart 113, but may be indicated using any suitable representation. Lifetime envelope 123 includes at least one point 117, and identifies the subset of the points 117 which correspond to versions of the new transistor that have a predicted lifetime which meets a predetermined criteria. In the disclosed embodiment, the predicted lifetime is considered acceptable if it represents a degradation in drive current over a period of one year which is less than 10%.

Proceeding to block 126, a report is generated, for example on a printer or visual display which are discussed later. In the disclosed embodiment, the report includes chart 113 with envelope 123. Chart 113 has real-world value and provides immediate benefit to a user of the present invention, by providing an organized summary of information which is used to assist the user in selecting suitable values for the process conditions in order to obtain desired performance and lifetime characteristics.

Alternatively, the report may optionally be customized. For example, the report may be configured to include all or any portion of the information previously described, in addition to or in lieu of the chart 113. In particular, the report could include any of the specific values of the two process conditions, the values of the constants C. m and n, specific values for the predicted operational lifetimes, specific values for the gate overlap determined by simulation, specific values for the substrate current determined by simulation, specific values for the drive and off currents determined by simulation, and so forth.

Next, at block 128, selection is made of a suitable process for fabricating the new transistor, or in other words a particular combination of the two process conditions. Obviously, this would correspond to one of the points 117 within the envelope 123, representing a version of the new transistor having a drive current, off current and predicted lifetime which all meet the respective criteria discussed above. As to which of the point 117 within envelope 123 should be selected, preference is given to points which correspond to a large overlap, or in other words a low pocket doping and a high drain extender doping, and which correspond to a large drive current.

Figure 6:
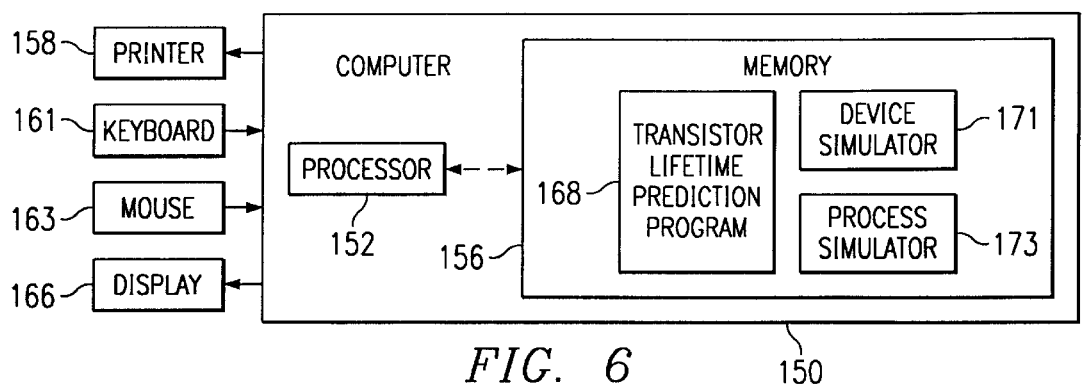
FIG. 6 is a block diagram illustrating a computer which can be used to carry out the inventive method embodied in the flowchart of FIG. 4.

Although the method according to the invention can be utilized without assistance from a computer, results can be obtained much more efficiently and rapidly if a computer is used. FIG. 6 is a block diagram illustrating a computer which can be used to carry out the present invention. More specifically, FIG. 6 shows a computer 150 which has a processor 152 and memory 156, and which is coupled to a printer 158, a keyboard 161, a mouse 163 and a display 166. Computer 150 may be any suitable general purpose computer, for example one of several workstations commercially available under the tradename SUN from Sun Microsystems, Inc. of Palo Alto, Calif.

Processor 152 is operatively coupled to the memory 156. Memory 156 stores a transistor lifetime prediction program 168, a device simulator program 171 and a process simulator program 173, each of which is executed by the processor 152. Program 168 provides the functionality of the operational lifetime prediction technique of the present invention, as described above in association with blocks 106, 108, 111, 121, 126 of FIG. 4. In the disclosed embodiment, the programs 171 and 173 are the MEDICI and SUPREM programs discussed above.

The present invention provides a number of technical advantages. One such technical advantage is the capability, for a given semiconductor technology, to predict an expected operational lifetime for a new transistor design over a wide range of possible process conditions, all without fabricating and testing a single actual transistor representing that particular design. A related advantage is that predicting the lifetime without fabricating transistors specific to the particular design provides significant savings in time and money over traditional fabrication-based lifetime determinations. A further related advantage is that the duration of the development cycle for new transistor designs is simplified, and reduced in length. Yet another advantage is that, since it is not necessary to build and test a number of transistors in order to complete a new design, the use of actual silicon material for development is reduced or eliminated, which represents a significant savings.

Although one embodiment has been illustrated and described in detail, it will be recognized that there are changes, substitutions and alterations which are possible without departing from the spirit and scope of the present invention, as defined by the following claims.

What is claimed is:

1. A method comprising the step of predicting an operational lifetime of a transistor, wherein said predicting of the operational lifetime includes solving the equation $$\tau = Ce^{(mX_{ov})}(I_{sub})^{-n}$$

where $\tau$ is the operational lifetime, $X_{ov}$ is a gate overlap of the transistor, $I_{sub}$ is a substrate current for the transistor, and C, m and n are each a respective constant for a semiconductor technology in which the transistor is to be implemented.

2. A method comprising:
   providing a process condition with a plurality of values associated with fabrication of a transistor;
   predicting a lifetime for each of said plurality of values;
   determining a transistor drive current for each of said plurality of values;
   determining a transistor off current for each of said plurality of values;
   evaluating the transistor drive current, the transistor off current, and the lifetime for said plurality of values against respective predetermined criteria; and
   identifying each of said plurality of values for which the transistor drive current, the transistor off current, and the lifetime satisfy the corresponding predetermined criteria.

3. A method according to claim 2, wherein said identifying includes plotting on a performance chart a point for each said value of said process condition for which the drive current and off current each satisfy the corresponding predetermined criteria.

4. A method according to claim 3, wherein said identifying further includes indicating which of the points plotted on the performance chart correspond to a predicted lifetime which meets the corresponding predetermined criteria.

5. A method comprising:
   fabricating a transistor based on a semiconductor technology;
   measuring lifetime and gate overlap information for the fabricated transistor;
   determining characteristic information as a function of the measured lifetime and gate overlap information; and
   predicting an operational lifetime of the transistor based on and on solving the equation $$\tau = Ce^{(mX_{ov})}(I_{sub})^{-n}$$

where $\tau$ is the operational lifetime, $X_{ov}$ is the gate overlap of the transistor, $I_{sub}$ is a substrate current for the transistor, and C, m and n are each a respective constant for a semiconductor technology in which the transistor is to be implemented.

6. A method according to claim 5, wherein said measuring of the gate overlap information includes measuring of a gate-to-drain capacitance for the fabricated transistor, and determining a gate overlap value based on the measured gate-to-drain capacitance.

7. A method according to claim 5, wherein said measuring of lifetime information includes applying to the transistor a selected voltage which induces a substrate current sufficiently large to stress the transistor.

8. An apparatus comprising:
   a computer having a computer readable memory and having a processor coupled to said memory; and
   an application program stored in said memory, said processor being operable when executing said application program to receive design data for a transistor and to predict an operational lifetime of said transistor by solving the equation $$\tau = Ce^{(mX_{ov})}(I_{sub})^{-n}$$

where $\tau$ is the operational lifetime, $X_{ov}$ is a gate overlap value for the transistor, $I_{sub}$ is a substrate current for the transistor, and C, m and n are each a respective constant for a semiconductor technology in which the transistor is to be implemented.

* * * * *